United States Patent
Honda et al.

(10) Patent No.: US 11,309,006 B2
(45) Date of Patent: Apr. 19, 2022

(54) MAGNETIC MEMORY DEVICES INCLUDING MAGNETIC STRUCTURE WITH MAGNETIC DOMAINS

(71) Applicant: Samsung Electronics Co., Ltd., Suwon-si (KR)

(72) Inventors: Syuta Honda, Suwon-si (KR); Yoshiaki Sonobe, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/082,557

(22) Filed: Oct. 28, 2020

(65) Prior Publication Data
US 2021/0125652 A1 Apr. 29, 2021

(30) Foreign Application Priority Data
Oct. 29, 2019 (JP) .............................. JP2019-196646

(51) Int. Cl.
*G11C 11/16* (2006.01)

(52) U.S. Cl.
CPC ...... *G11C 11/1673* (2013.01); *G11C 11/1675* (2013.01); *G11C 11/1693* (2013.01)

(58) Field of Classification Search
None
See application file for complete search history.

(56) References Cited

U.S. PATENT DOCUMENTS

| 2008/0080092 A1* | 4/2008 | Kim ........................ G11B 5/255 360/110 |
| 2008/0080234 A1* | 4/2008 | Iwata ...................... G11C 21/00 365/171 |

(Continued)

FOREIGN PATENT DOCUMENTS

| JP | 2007073103 A | 3/2007 |
| JP | 2016092066 A | 5/2016 |
| JP | 2017011135 A | 1/2017 |

(Continued)

OTHER PUBLICATIONS

L. Le Guyader et al., "Nanoscale Sub-100 Picosecond All-optical Magnetization Switching in GdFeCo Microstructures", Nature Communications, DOI: 10.1038/ncomms6839, pp. 5839-1-5839-6 (2015).

(Continued)

*Primary Examiner* — J. H. Hur
(74) *Attorney, Agent, or Firm* — Myers Bigel, P.A.

(57) ABSTRACT

A magnetic memory device includes a first magnetic structure having a magnetic anisotropy, a read electrode that is on an end of the first magnetic structure and configured to sense a first magnetic moment of the first magnetic structure and to convert the first magnetic moment to an electric signal, a second magnetic structure spaced apart from the first magnetic structure, the second magnetic structure having a magnetic anisotropy, and a write electrode that is on an end of the second magnetic structure and configured to change a second magnetic moment of the second magnetic structure, based on the electric signal. The magnetic memory device executes operations of writing, moving, and reading data on almost the entire region of the magnetic structure in a more efficient manner, compared with the conventional magnetic memory device.

14 Claims, 12 Drawing Sheets

(56) References Cited

U.S. PATENT DOCUMENTS

2009/0303631 A1* 12/2009 Rhie .................. G11C 11/1675
360/69
2010/0002486 A1* 1/2010 DeBrosse ............. G11C 11/161
365/80

FOREIGN PATENT DOCUMENTS

| JP | 2017112351 A | 6/2017 |
|----|--------------|--------|
| JP | 2017168514 A | 9/2017 |

OTHER PUBLICATIONS

S.S.P. Parkin et al., "Magnetic Domain-Wall Racetrack Memory", Science, vol. 320 Apr. 11, 2008, pp. 190-194.
Mayumi Kawana et al., "Magnetic Nanowire Memory Utilizing Motion of Magnetic Domains for Developing a Highspeed Recording Device", NHK R&D, No. 160 (Nov. 2016).
Daichi Chiba et al., "Control of Multiple Magnetic Domain Walls by Current in a Co/Ni Nano-Wire", Applied Physics Express 3, 073004 (2010).
Syuta Honda et al., "Magnetic Domain with Straight Domain Walls Passing Through a Ferromagnetic Insulator for a Continuously Looped Racetrack Memory", Transactions on Magnetics, DOI 10.1109/TMAG.2020.3010328, IEEE.

* cited by examiner

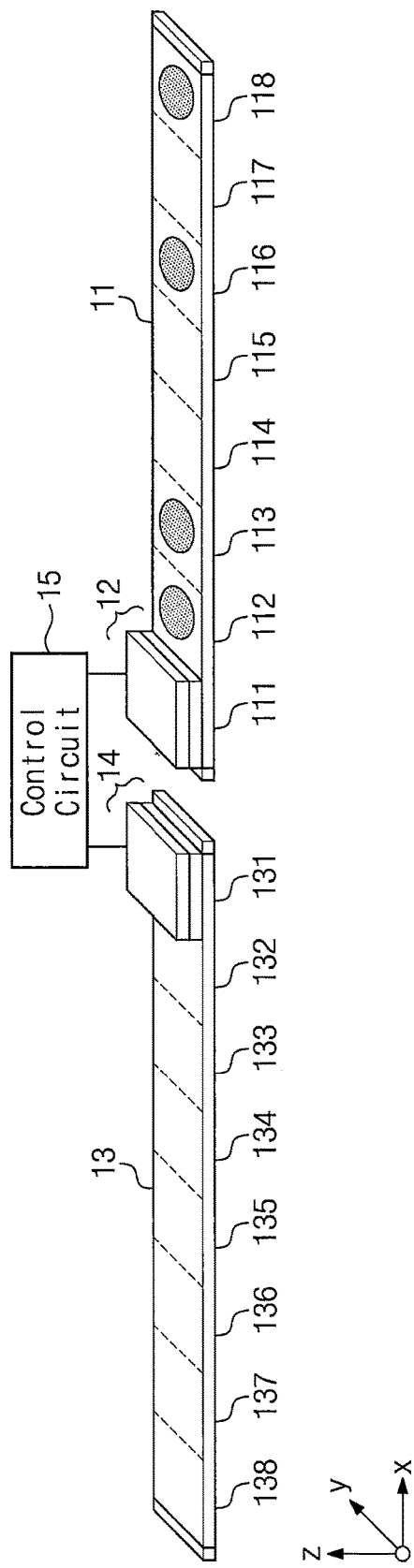
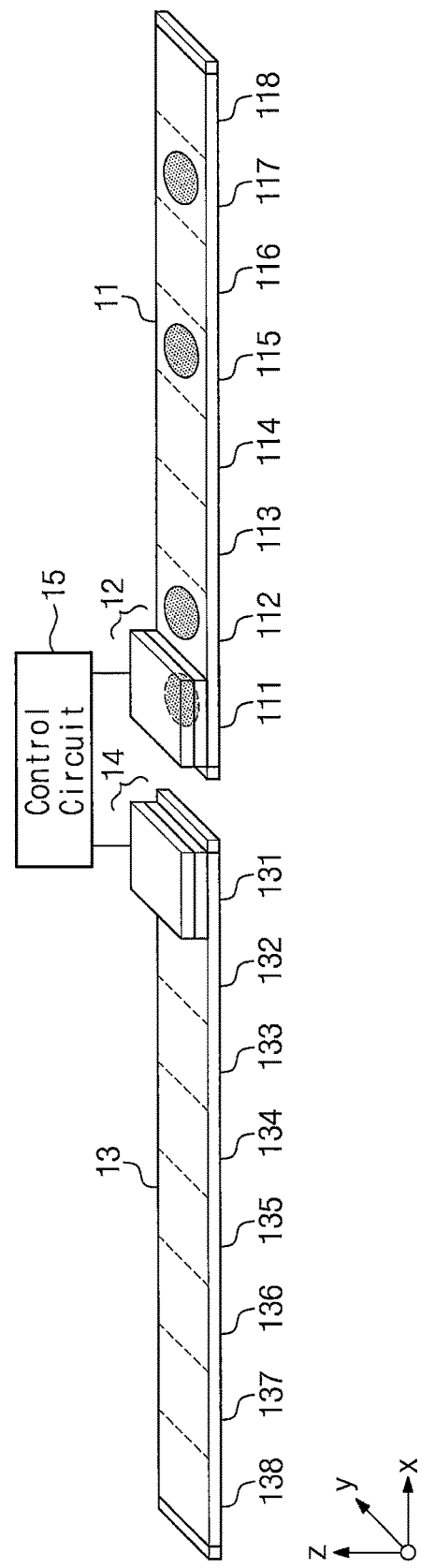

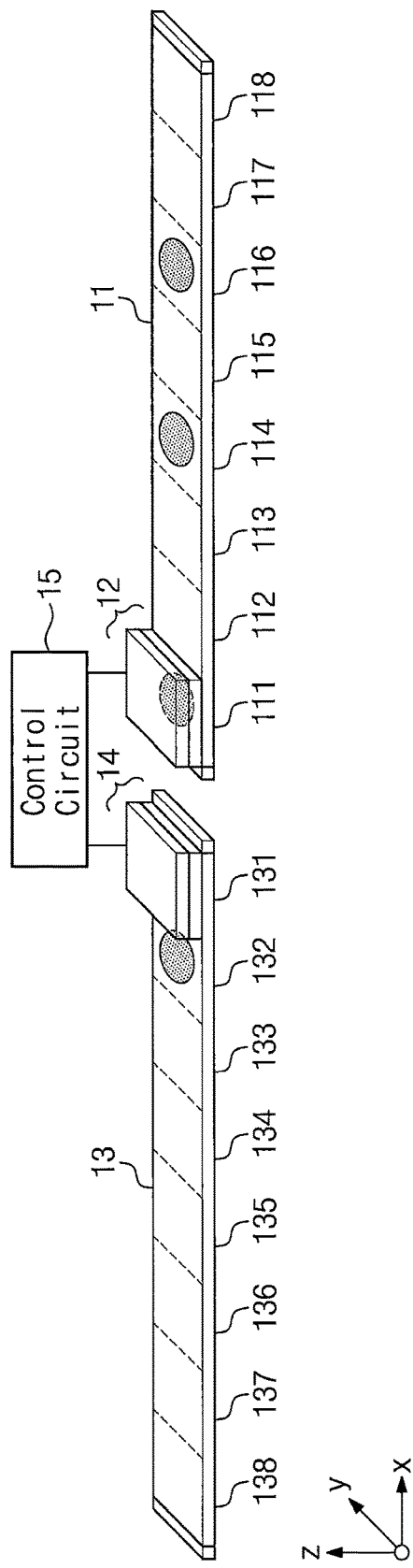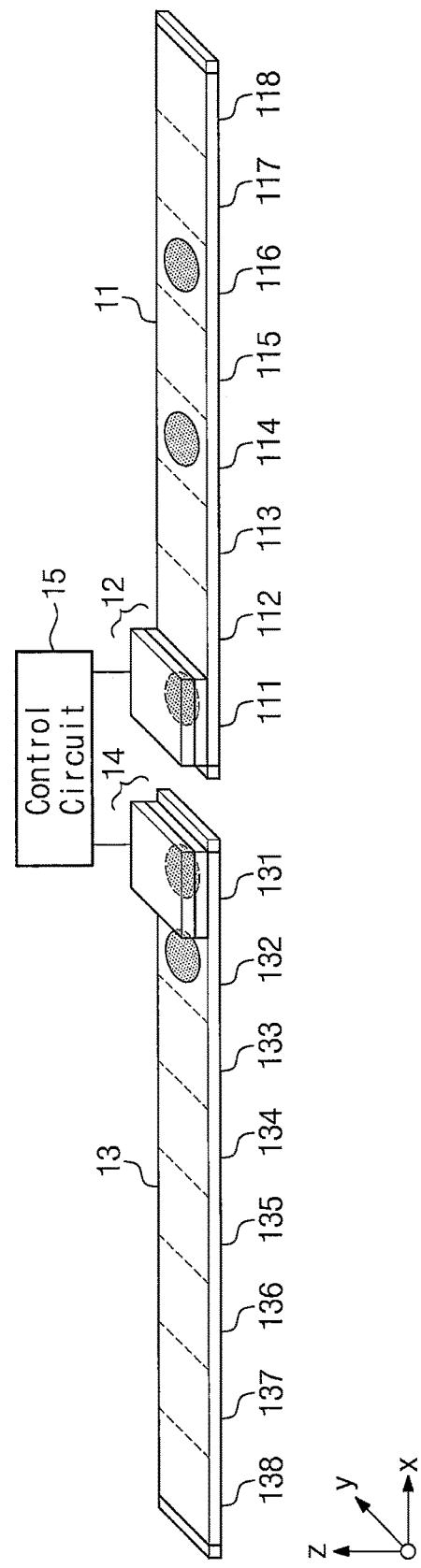

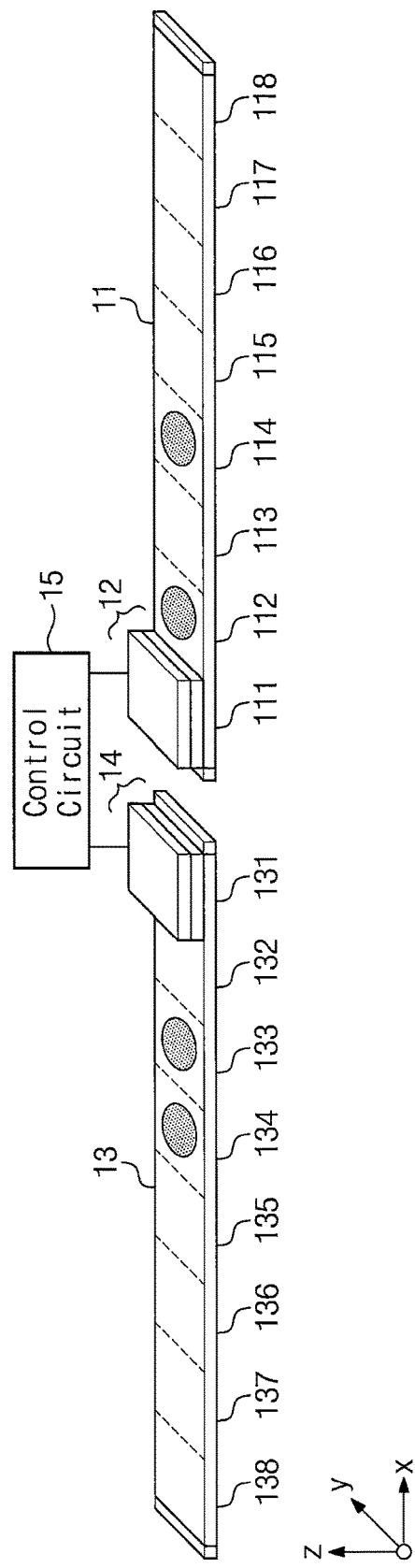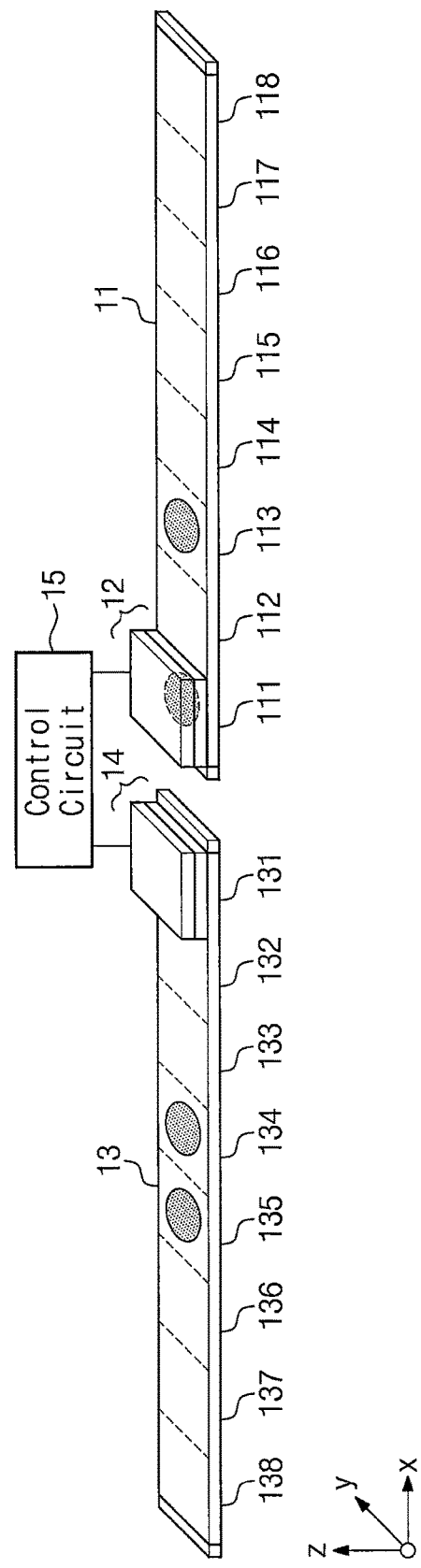

MAGNETIC MEMORY DEVICES INCLUDING MAGNETIC STRUCTURE WITH MAGNETIC DOMAINS

CROSS-REFERENCE TO RELATED APPLICATION

This U.S. non-provisional patent application claims priority under 35 U.S.C. § 119 to Japanese Patent Application No. 2019-196646, filed on Oct. 29, 2019, in the Japanese Intellectual Property Office, the entire contents of which are hereby incorporated by reference.

BACKGROUND OF THE INVENTION

The present disclosure relates to magnetic memory devices.

An example of a magnetic memory having an ultra-high speed writing property is a Hard Disk Drive (HDD). The magnetic memory is configured to write 2-bit data using a dipole magnet. For the magnetic memory, it is possible to complete a writing operation in a short time (e.g., within several tens of picoseconds). With regard to an actual writing time, it has been reported that a writing speed of the magnetic memory is 10 to 20 times faster than that of a semiconductor memory (e.g., see L. Le Guyader, et al., "Nanoscale sub-100 picosecond all-optical magnetization switching in GdFeCo microstructures," Nature Communications, 6, pp. 5839-1-5839-6 (2015)).

In the magnetic memory, a direction of a magnet is changed to an N (north) or S (south) pole. That is, for the magnetic memory, it takes a very short time to change the magnetization direction because a spin direction of an electron constituting the magnet is changed in place. However, for a device (e.g., HDD) using a magnetic structure, a motor may be used to rotate and move a writing medium. Furthermore, a position of a magnetic head in the device may be controlled to perform a writing or reading operation, and thus, a writing or reading speed is limited by an operation speed of a mechanical driving part. Therefore, it is difficult to increase a writing speed of a device.

For a magnetic memory without a mechanical driving part, it is possible to realize the inherent high-speed writing performance of a magnetic structure. Accessing magnetization data without a mechanical driving part may be used to exploit the high-speed writing performance of the magnetic memory.

Recently, a current-driven domain wall moving phenomenon has been discovered, in which a magnetic domain wall is moved when a current is applied to a one-dimensional magnetic nanowire obtained by processing a magnetic material in a line shape of several hundreds of nanometers. Various studies are being conducted to electrically access a magnetization data using this phenomenon.

A racetrack memory has a 'U'-shaped three-dimensional structure including a magnetic nanowire, which is extended in a direction perpendicular to a substrate, and is configured to exploit the domain wall moving phenomenon (e.g., see S. S. P Parkin, M. Hayashi, and L. Thomas, "Magnetic Domain-Wall Racetrack Memory," Science, 320 190 (Apr. 11, 2008)). In the racetrack memory, a magnetic domain is produced in a magnetic nanowire using a writing head, and a pulsed current is applied to the magnetic nanowire in a lateral direction. It is possible to realize a random access in the racetrack memory, although it takes a somewhat long time to read data from an end. In addition, a data reading in the racetrack memory may be executed with a magnetic tunnel junction (MTJ) device.

SUMMARY

In order to read data from opposite ends of a racetrack memory, an extra space, to which a magnetic domain wall can be moved, may be provided in the racetrack memory. This may lead to a reduction in writing capacity of the racetrack memory and may lead to a difficulty in efficiently writing and reading data from the opposite ends of the racetrack memory.

According to some embodiments of the inventive concepts, a magnetic memory device includes a first magnetic structure having a first magnetic anisotropy, a read electrode on an end of the first magnetic structure and configured to sense a first magnetic moment of the first magnetic structure and to convert the first magnetic moment to an electric signal, a second magnetic structure spaced apart from the first magnetic structure, the second magnetic structure comprising a second magnetic anisotropy, and a write electrode on an end of the second magnetic structure and configured to change a second magnetic moment of the second magnetic structure based on the electric signal.

According to some embodiments of the inventive concepts, a magnetic memory device includes a magnetic structure comprising a magnetic anisotropy, a read electrode on an end of the magnetic structure and configured to sense a first magnetic moment of the magnetic structure and to convert the first magnetic moment to an electric signal, and a write electrode on an opposite end of the magnetic structure and configured to change a second magnetic moment of the magnetic structure based on the electric signal.

According to some embodiments of the inventive concepts, a magnetic memory device, comprising a magnetic structure comprising a magnetic anisotropy, a read electrode on a first end of the magnetic structure and configured to sense a first magnetic moment of the magnetic structure and to convert the first magnetic moment to an electric signal, a write electrode on a second end of the magnetic structure and configured to change a second magnetic moment of the magnetic structure based on the electric signal, and a control circuit that is configured to transfer data that is read by the read electrode to the write electrode

BRIEF DESCRIPTION OF THE DRAWINGS

FIGS. 2A to 2C are schematic diagrams illustrating an example of reading and writing operations on a magnetic memory device, according to an embodiment of the inventive concepts.

FIGS. 3A to 3C are schematic diagrams illustrating an example of reading and writing operations on a magnetic memory device, according to an embodiment of the inventive concepts.

FIGS. 4A to 4C are schematic diagrams illustrating an example of reading and writing operations on a magnetic memory device, according to an embodiment of the inventive concepts.

DETAILED DESCRIPTION

Example embodiments of the inventive concepts will now be described more fully with reference to the accompanying drawings, in which example embodiments are shown.

Figure 1:
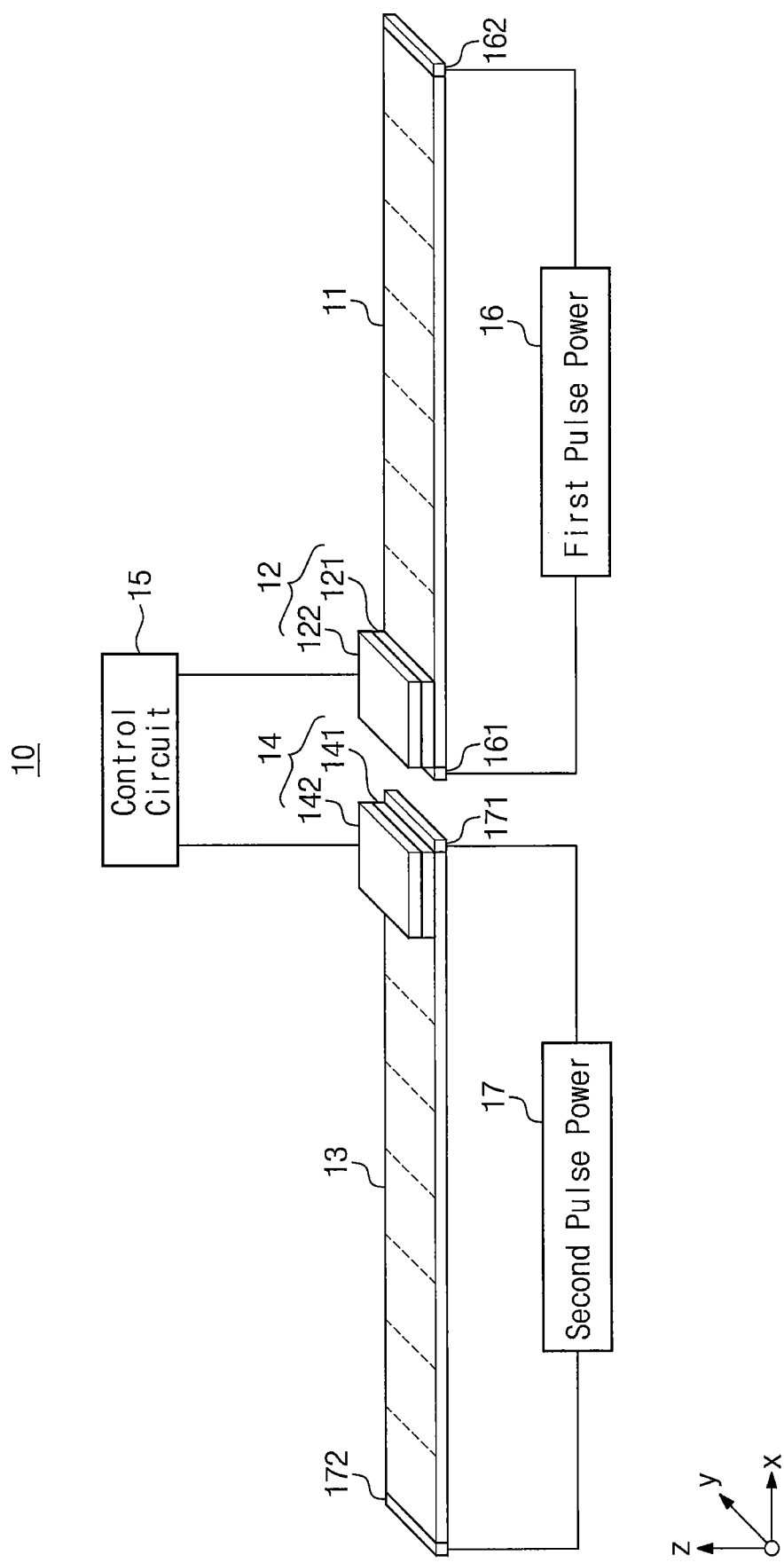
FIG. 1 is a perspective view illustrating a schematic structure of a magnetic memory device according to an embodiment of the inventive concepts.

FIG. 1 is a perspective view illustrating a schematic structure of a magnetic memory device 10 according to an embodiment of the inventive concepts. A magnetic memory device 10 may include a first magnetic structure 11, a read electrode 12, a second magnetic structure 13, a write electrode 14, a control circuit 15, a first pulse power source 16, and a second pulse power source 17. At least the first magnetic structure 11, the read electrode 12, the second magnetic structure 13, and the write electrode 14 may constitute a magnetic memory element. In some embodiments, the first magnetic structure 11 and the second magnetic structure 13 may be referred to in combination as a magnetic structure.

The first magnetic structure 11 may have a magnetic anisotropy. In an embodiment, the first magnetic structure 11 may include a ferromagnetic metal. The first magnetic structure 11 may be a magnetic nanowire that is composed of a long and thin magnetic structure. A magnetic domain wall of the first magnetic structure 11 may be moved by a current flowing therethrough, where the magnetic domain wall refers to a boundary between magnetic domains having their own magnetization directions. Thus, the magnetic memory device may serve as a domain wall movable-type magnetic memory. For example, the first magnetic structure 11 may be formed of or include at least one of Co/Ni multilayer, CoNi alloy, Co/Pd multilayer, CoPd alloy, Co/Pt multilayer, CoPt alloy, Tb/FeCo multilayer, TbFeCo alloy, Fe/Ni multilayer, FeNi alloy, CoFe alloy, and/or CoFeB alloy.

The read electrode 12 may sense a magnetic moment of the first magnetic structure 11 and then may convert the sensed magnetic moment to an electric signal. In an embodiment, the read electrode 12 may be disposed on an end portion of the first magnetic structure 11. In an embodiment, the read electrode 12 may include a first non-magnetic layer 121, which is disposed on the first magnetic structure 11, and a first fixed layer 122, which is disposed on the first non-magnetic layer 121.

The first non-magnetic layer 121 may be formed of or include an insulating layer (e.g., of MgO). In an embodiment, the first non-magnetic layer 121 may be formed of or include an oxide material having a NaCl structure. In certain embodiments, the first non-magnetic layer 121 may include CaO, SrO, TiO, VO, and/or NbO, but the first non-magnetic layer 121 is not limited to a specific material, as long as it serves as the first non-magnetic layer 121. For example, the first non-magnetic layer 121 may include the spinel-type $MgAl_2O_4$ or the like.

The first fixed layer 122 may be a layer which has a fixed magnetization direction and is called a pinned layer. For example, the first fixed layer 122 may be a ferromagnetic metal layer. For example, the first fixed layer 122 may be formed of or include at least one of CoFeB, CoFe alloy, and/or Co/Pt multilayer. The read electrode 12 may read data of a magnetic domain of the first magnetic structure 11 by sensing a magnetic moment of the first magnetic structure 11 using a current flowing between the first magnetic structure 11 and the first fixed layer 122.

The second magnetic structure 13 may have a magnetic anisotropy. The second magnetic structure 13 may be disposed to be spaced apart from the first magnetic structure 11. In an embodiment, the second magnetic structure 13 may include a ferromagnetic metal. The second magnetic structure 13 may be a magnetic nanowire that is composed of a magnetic structure of a long and thin shape. A magnetic domain wall in the second magnetic structure 13 may be moved by a current flowing through the second magnetic structure 13. Thus, the magnetic memory device may serve as a domain wall movable-type magnetic memory. For example, the second magnetic structure 13 may be formed of or include at least one of Co/Ni multilayer, CoNi alloy, Co/Pd multilayer, CoPd alloy, Co/Pt multilayer, CoPt alloy, Tb/FeCo multilayer, TbFeCo alloy, Fe/Ni multilayer, FeNi alloy, CoFe alloy, and/or CoFeB alloy, similar to the first magnetic structure 11.

The write electrode 14 may be used to execute a data writing operation of changing a magnetic moment of the second magnetic structure 13. In an embodiment, the write electrode 14 may be disposed on an end portion of the second magnetic structure 13. In an embodiment, the write electrode 14 may include a second non-magnetic layer 141, which is disposed on the second magnetic structure 13, and a second fixed layer 142, which is disposed on the second non-magnetic layer 141.

The second non-magnetic layer 141 may be formed of or include an insulating layer (e.g., of MgO). In an embodiment, the second non-magnetic layer 141 may be formed of or include an oxide material having a NaCl structure. In certain embodiments, the second non-magnetic layer 141 may include CaO, SrO, TiO, VO, and/or NbO, but the second non-magnetic layer 141 is not limited to a specific material, as long as it serves as the second non-magnetic layer 141. For example, the second non-magnetic layer 141 may include the spinel-type $MgAl_2O_4$ or the like.

The second fixed layer 142 may be a layer which has a fixed magnetization direction and is called a pinned layer. For example, the second fixed layer 142 may be a ferromagnetic metal layer. For example, the second fixed layer 142 may be formed of or include at least one of CoFeB, CoFe alloy, and/or Co/Pt multilayer. The write electrode 14 may execute a data writing operation of changing a magnetic moment of the second magnetic structure 13 using a current flowing between the second magnetic structure 13 and the second fixed layer 142.

The control circuit 15 may control an operation of reading data from the first magnetic structure 11 and an operation of writing data in the second magnetic structure 13. For example, when a magnetic domain of the first magnetic structure 11 is moved by the first pulse power source 16, the control circuit 15 may execute an operation of reading data from the first magnetic structure 11 using the read electrode 12. When a magnetic domain of the second magnetic structure 13 is moved by the second pulse power source 17, the control circuit 15 may execute an operation of writing data in the second magnetic structure 13, using the write electrode 14.

For example, the control circuit 15 may determine data, based on the presence or absence (or an amount) or a direction of the current output from the read electrode 12. For example, the control circuit 15 may determine data, based on the presence or absence (or an amount) or a direction of the current flowing through the write electrode 14, and execute a writing operation.

In the case where a domain moving speed in the first magnetic structure 11 is equal to a domain moving speed in the second magnetic structure 13, the control circuit 15 may write the data read from the first magnetic structure 11 to the second magnetic structure 13 as it is (e.g., without adjustment).

In the case where a writing speed is slower than a reading speed, a domain moving speed in the second magnetic structure 13 may be adjusted to be slower than a domain moving speed in the first magnetic structure 11. In this case, the control circuit 15 may buffer the data read from the first magnetic structure 11 and may write the data in the second magnetic structure 13 when the movement of the magnetic domain in the second magnetic structure 13 is finished. In this case, the control circuit 15 may include a temporary memory circuit, which is configured to buffer data read from the first magnetic structure 11 and to sequentially output the data to the write electrode 14.

The control circuit 15 may be configured to output data, which is read by the read electrode 12, to both of the write electrode 14 and the outside (e.g., external to the magnetic memory device 10 and/or the control circuit 15).

The first pulse power source 16 may be configured to provide a current to opposite ends of the first magnetic structure 11. The first pulse power source 16 may apply a pulsed voltage to opposite ends of the first magnetic structure 11, and in this case, a magnetic domain in the first magnetic structure 11 may be moved. In detail, the first pulse power source 16 may apply a voltage between an electrode 161 and an electrode 162. The electrode 161 may be disposed at the end of the first magnetic structure 11, which is adjacent to the read electrode 12, and the electrode 162 may be disposed at an opposite end of the first magnetic structure 11. In an embodiment, the electrodes 161 and 162 may be formed of at least one of non-magnetic metals.

The second pulse power source 17 may be configured to provide a current to opposite ends of the second magnetic structure 13. The second pulse power source 17 may apply a pulsed voltage to the opposite ends of the second magnetic structure 13, and in this case, a magnetic domain may be moved in the second magnetic structure 13. For example, the second pulse power source 17 may apply a voltage between an electrode 171 and an electrode 172. The electrode 171 may be placed at one of the opposite ends of the second magnetic structure 13, which is adjacent to the write electrode 14, and the electrode 172 may be placed at the other of the opposite ends of the second magnetic structure 13. In an embodiment, the electrodes 171 and 172 may be formed of or include at least one of non-magnetic metals. As shown in FIG. 1, the electrode 171 of the second pulse power source 17 may be disposed to be spaced apart from the electrode 161 of the first pulse power source 16.

To precisely control the position of the magnetic domain, each of the first and second pulse power sources 16 and 17 may be configured to produce a current of rectangular-like waveform, in ON/OFF steps. In detail, a DC applying time of each of the first and second pulse power sources 16 and 17 may be given by n*t, where t denotes a current applying time taken to move the magnetic domain by a one bit length and n is an integer of 1 or greater. The first and second pulse power sources 16 and 17 may apply a voltage suitable for a current driving of the magnetic domain. For example, the voltage may be determined in consideration of resistance values and domain wall moving speeds of the first and second magnetic structures 11 and 13. The first and second pulse power sources 16 and 17 are illustrated as functional blocks in FIG. 1.

As a result of the previously described configuration, the magnetic memory device 10 may execute the operation of reading data from the first magnetic structure 11 and the operation of writing data in the second magnetic structure 13. Next the reading and writing operations will be described in more detail below. FIGS. 2A to 2C, 3A to 3C, and 4A to 4C are schematic diagrams illustrating an example of reading and writing operations on a magnetic memory device (e.g., magnetic memory device 10 of FIG. 1) according to an embodiment of the inventive concepts. Referring to FIGS. 2A to 2C, 3A to 3C, and 4A to 4C, two values 0 and 1 in the binary number will be defined as the presence and absence of a bubble in a bubble domain, and operations of reading data from the first magnetic structure 11 and writing data in the second magnetic structure 13 will be described by example based on the presence and absence of the bubble. A bubble within a bubble memory may refer to a small magnetized area, storing one bit of data, that can be held or moved by a magnetic material (e.g., a thin film).

FIG. 2A illustrates an example of an initial state of the magnetic memory device (e.g., magnetic memory device 10 of FIG. 1). In an initial state shown in FIG. 2A, the bubble may be present in each of second, third, sixth, and eighth regions 112, 113, 116, and 118 of the first magnetic structure 11 and the bubble may be absent in first, fourth, fifth, and seventh regions 111, 114, 115, and 117 of the first magnetic structure 11.

Figure 2C:
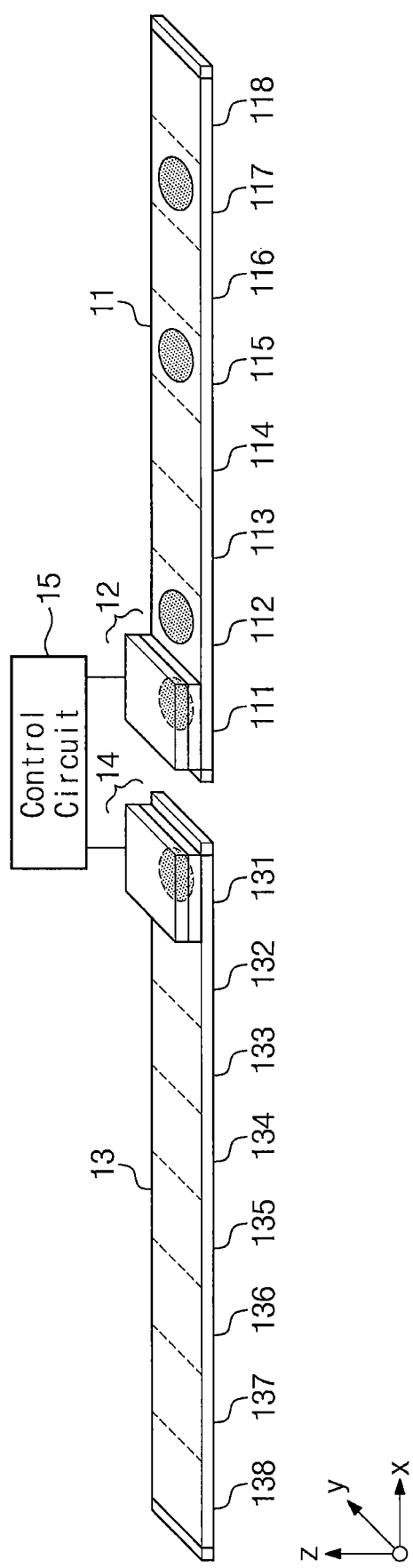

In the initial state shown in FIG. 2A, if a magnetic domain of the first magnetic structure 11 is moved to the left, the first magnetic structure 11 may be in a new state shown in FIG. 2B. In the intermediate state illustrated in FIG. 2B, there may be a bubble in each of the first, second, fifth, and seventh regions 111, 112, 115, and 117 of the first magnetic structure 11, and there may be no bubble in the third, fourth, sixth, and eighth regions 113, 114, 116, and 118 of the first magnetic structure 11. In such an intermediate state, the read electrode 12 may read data from the first region 111. FIG. 2C illustrates a state of the second magnetic structure 13, in which the data of the first region 111 is written. As shown in FIG. 2C, the data of the first region 111 of the first magnetic structure 11 may be written in a first region 131 of the second magnetic structure 13. Referring to FIG. 2C, the bubble may be present in each of the first, second, fifth, and seventh regions 111, 112, 115, and 117 of the first magnetic structure 11, and the bubble may be absent in the third, fourth, sixth, and eighth regions 113, 114, 116, and 118 of the first magnetic structure 11. The bubble may be present in the first region 131 of the second magnetic structure 13, and the bubble may be absent in second to eighth regions 132 to 138 of the second magnetic structure 13.

In the state shown in FIG. 2C, if a magnetic domain of the first magnetic structure 11 and a magnetic domain of the second magnetic structure 13 are moved to the left, the magnetic memory device may be in a new state of FIG. 3A. Referring to FIG. 3A, the bubble may be present in each of the first, fourth, and sixth regions 111, 114, and 116 of the first magnetic structure 11, and the bubble may be absent in the second, third, fifth, seventh and eighth regions 112, 113, 115, 117, and 118 of the first magnetic structure 11. The bubble may be present in the second region 132 of the second magnetic structure 13, and the bubble may be absent in the first, and third to eighth regions 131 and 133 to 138 of the second magnetic structure 13.

Data, which will be read in the next step, may be present in the first region 111 of the first magnetic structure 11, and the first region 131 of the second magnetic structure 13 may be allocated as a region, in which the data will be written. In this state, the read electrode 12 may read data of the first region 111. FIG. 3B illustrates a state of the magnetic memory device, in which the data of the first region 111 of the first magnetic structure 11 is written in the first region 131 of the second magnetic structure 13. Referring to FIG. 3B, the bubble may be present in each of the first and second regions 131 and 132 of the second magnetic structure 13, and the bubble may be absent in the third to eighth regions 133 to 138 of the second magnetic structure 13.

Figure 3C:
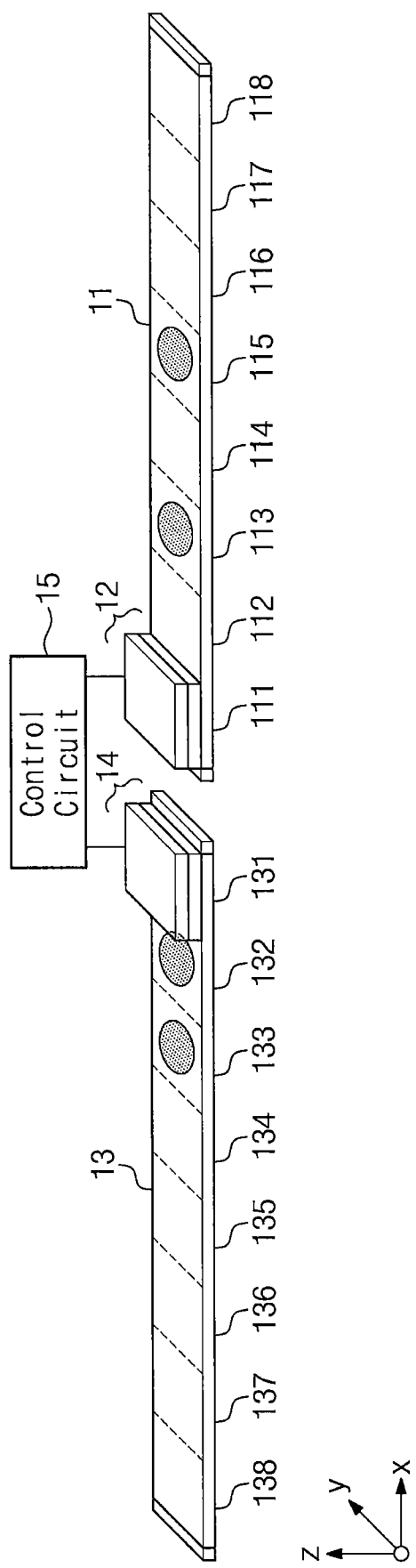

In the state shown in FIG. 3B, if a magnetic domain of the first magnetic structure 11 and a magnetic domain of the second magnetic structure 13 are moved to the left, the magnetic memory device may be in a new state of FIG. 3C. Referring to FIG. 3C, the bubble may be present in each of the third and fifth regions 113 and 115 of the first magnetic structure 11, and the bubble may be absent in the first, second, fourth, and sixth to eighth regions 111, 112, 114, and 116 to 118 of the first magnetic structure 11. The bubble may be present in each of the second and third regions 132 and 133 of the second magnetic structure 13, and the bubble may be absent in the first and fourth to eighth regions 131 and 134 to 138 of the second magnetic structure 13.

In this state, the read electrode 12 may read data of the first region 111. In this case, since there is no bubble in the magnetic domain of the first region 111 of the first magnetic structure 11, data may not be written in the first region 131 of the second magnetic structure 13.

In the state shown in FIG. 3C, if a magnetic domain of the first magnetic structure 11 and a magnetic domain of the second magnetic structure 13 are moved to the left, the magnetic memory device may be in a new state of FIG. 4A. Referring to FIG. 4A, the bubble may be present in each of the second and fourth regions 112 and 114 of the first magnetic structure 11, and the bubble may be absent in the first, third, and fifth to eighth regions 111, 113, and 115 to 118 of the first magnetic structure 11. The bubble may be present in each of the third and fourth regions 133 and 134 of the second magnetic structure 13, and the bubble may be absent in the first, second, and fifth to eighth regions 131, 132, and 135 to 138 of the second magnetic structure 13.

In this state, the read electrode 12 may read data of the first region 111. In this case, since there is no bubble in the magnetic domain of the first region 111 of the first magnetic structure 11, data may not be written in the first region 131 of the second magnetic structure 13.

In the state shown in FIG. 4A, if a magnetic domain of the first magnetic structure 11 and a magnetic domain of the second magnetic structure 13 are moved to the left, the magnetic memory device may be in a new state of FIG. 4B. Referring to FIG. 4B, the bubble may be present in each of the first and third regions 111 and 113 of the first magnetic structure 11, and the bubble may be absent in the second and fourth to eighth regions 112 and 114 to 118 of the first magnetic structure 11. The bubble may be present in each of the fourth and fifth regions 134 and 135 of the second magnetic structure 13, and the bubble may be absent in the first to third and sixth to eighth regions 131 to 133 and 136 to 138 of the second magnetic structure 13.

Figure 4C:
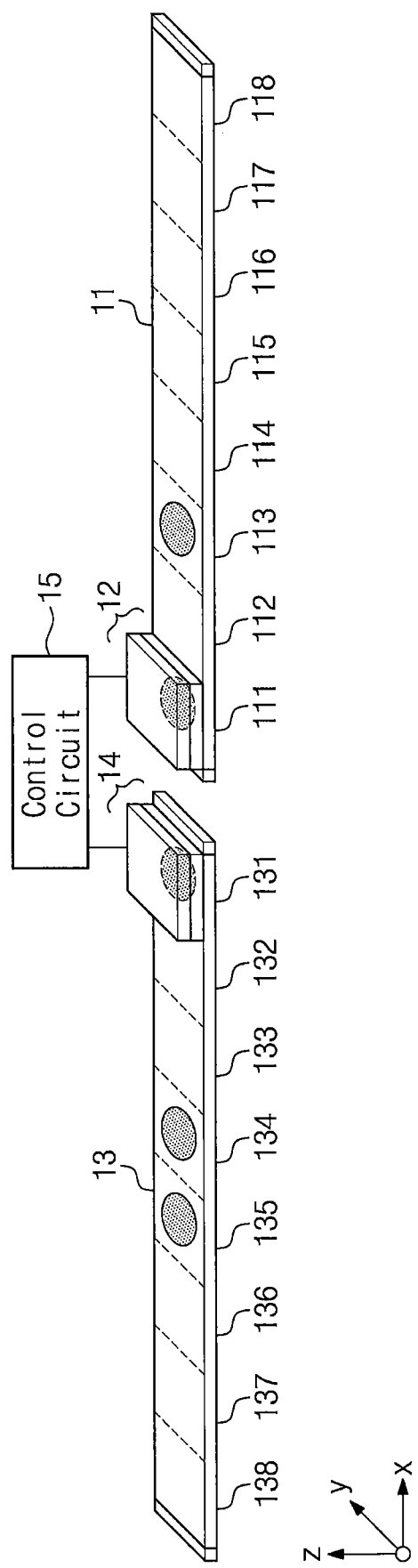

In this state, the read electrode 12 may read data of the first region 111. FIG. 4C illustrates a state of the magnetic memory device, in which the data of the first region 111 of the first magnetic structure 11 is written in the first region 131 of the second magnetic structure 13. Referring to FIG. 4C, the bubble may be present in each of the first and third regions 111 and 113 of the first magnetic structure 11, and the bubble may be absent in the second and fourth to eighth regions 112 and 114 to 118 of the first magnetic structure 11. The bubble may be present in each of the first, fourth, and fifth regions 131, 134, and 135 of the second magnetic structure 13, and the bubble may be absent in the second, third, and sixth to eighth regions 132, 133, and 136 to 138 of the second magnetic structure 13.

In an embodiment, the magnetic memory device may further include a power source, which is used to apply a driving current pulse to the magnetic structure. The magnetic memory device according to an embodiment of the inventive concepts may execute operations of writing, moving, and reading data on almost the entire region of the magnetic structure in a more efficient manner, compared with the conventional magnetic memory device.

In addition, data, which is read from the first magnetic structure 11 and is written in the second magnetic structure 13, may be suitable for a stripe domain, a bubble domain, or a skyrmion.

For the stripe domain, the operations of reading data from the first magnetic structure 11 and writing data in the second magnetic structure 13 may be executed using binary numbers of 0 and 1 as a downward magnetic domain and an upward magnetic domain, respectively.

For the bubble domain, the operations of reading data from the first magnetic structure 11 and writing data in the second magnetic structure 13 may be executed using the binary numbers of 0 and 1 as a bubble absence and the bubble presence, respectively.

For the skyrmion, the operations of reading data from the first magnetic structure 11 and writing data in the second magnetic structure 13 may be executed using the binary numbers of 0 and 1 as a skyrmion absence and a skyrmion presence, respectively.

FIG. 1 illustrates an example in which the first and second magnetic structures 11 and 13 are located on a single straight line, and it may be sufficient if the first and second magnetic structures 11 and 13 are spaced apart from each other. The arrangement or disposition of the first and second magnetic structures 11 and 13 is not limited to being located on the single straight line.

Hereinafter, the structure of the control circuit 15 will be described in more detail. The configuration to be described below will be applied to cases meeting the following conditions.

Condition 1: Timing and speed in a data reading operation from the first magnetic structure 11 are equal to those in a data writing operation in the second magnetic structure 13.

Condition 2: A magnitude of a reading current is equal to that of a writing current.

Condition 3: In the case of zero reading, there is nothing to do; for example, as described with reference to the example of the bubble domain, when a bubble is absent in a region of the first magnetic structure 11, no data is written in a corresponding region of the second magnetic structure 13.

Figure 5:
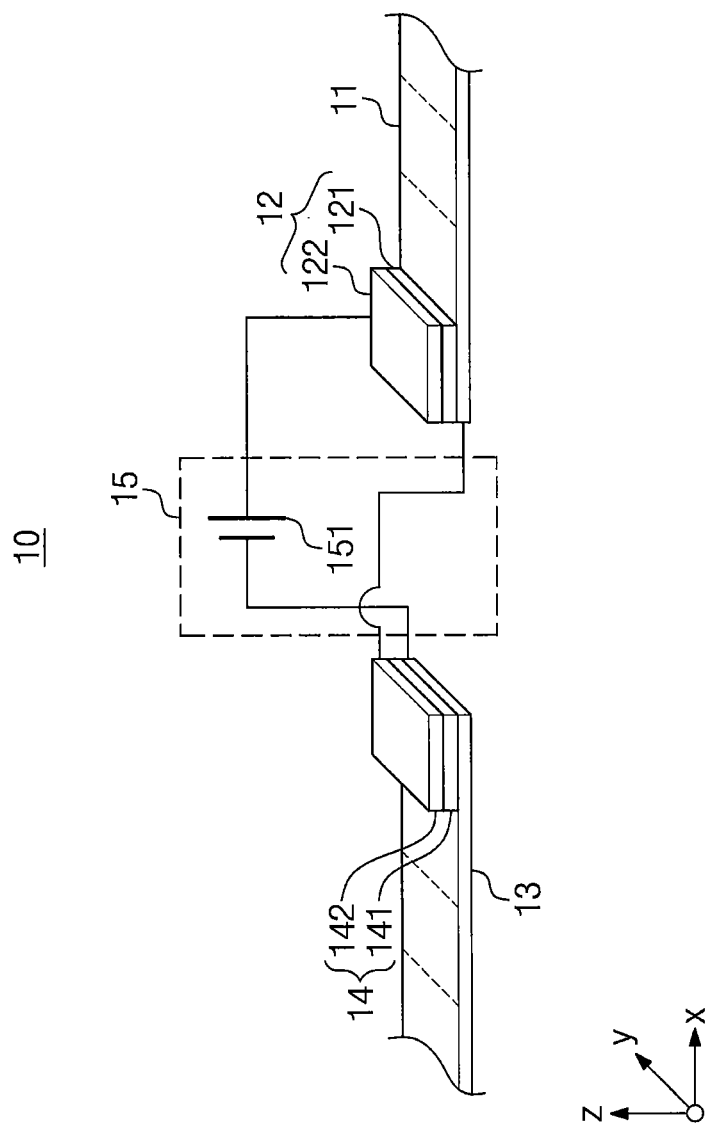
FIG. 5 is a circuit diagram illustrating an example of a control circuit of a magnetic memory device according to an embodiment of the inventive concepts.

FIG. 5 is a circuit diagram illustrating an example of a control circuit 15 of a magnetic memory device 10. Referring to FIG. 5, the control circuit 15 may include a DC power source 151. The control circuit 15 may be coupled to the first magnetic structure 11 and the second fixed layer 142.

The DC power source 151 may include two ends, which are coupled to the first fixed layer 122 and the second magnetic structure 13, respectively.

As a result of the previously described configuration, if the first region 111 of the first magnetic structure 11 is in a "bubble absence" state indicating the binary number of 0, magnetoresistance between the first fixed layer 122 of the read electrode 12 and the first magnetic structure 11 may have a high resistance value. Thus, the control circuit 15 may detect that the state is in a no-current state. In this case, since there is substantially no current flow between the second fixed layer 142 of the write electrode 14 and the second magnetic structure 13, a bubble domain may not be written in the first region 131 of the second magnetic structure 13 (i.e., the bubble absence).

By contrast, if the first region 111 of the first magnetic structure 11 is in a "bubble presence" state indicating the binary number of 1, the magnetoresistance between the first fixed layer 122 of the read electrode 12 and the first magnetic structure 11 may have a low resistance value. In this case, there may be a current flow between the second fixed layer 142 of the write electrode 14 and the second magnetic structure 13, and thus, a bubble domain may be written in the first region 131 of the second magnetic structure 13 (i.e., the bubble presence).

In the case where the conditions 1-3 are met, it may be possible for the control circuit 15 to execute an operation of reading data from the first magnetic structure 11 and an operation of writing data in the second magnetic structure 13 by using the simple configuration of FIG. 5.

Figure 6:
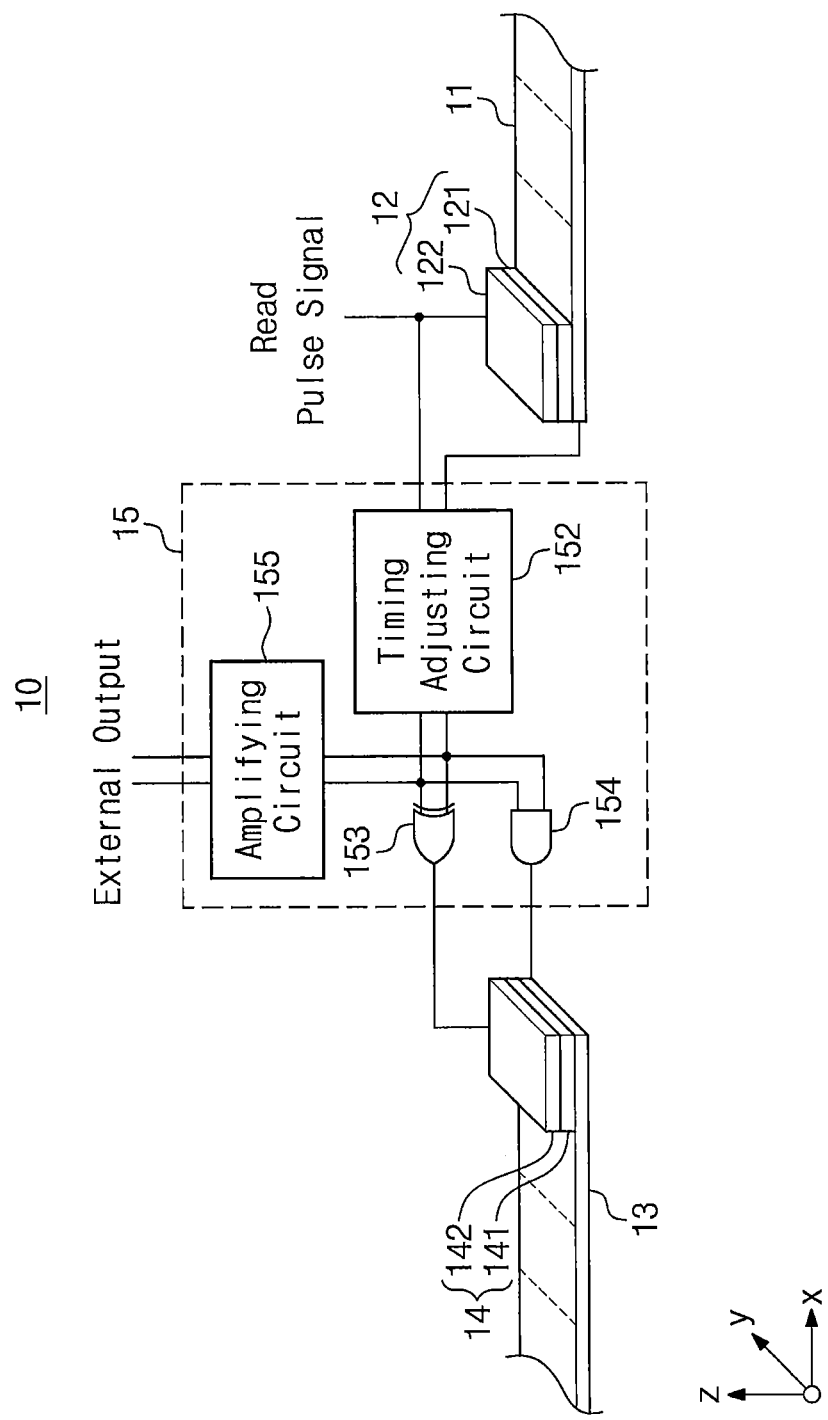
FIG. 6 is a circuit diagram illustrating another example of a control circuit of a magnetic memory device according to an embodiment of the inventive concepts.

Next, another example of the control circuit 15 will be described. In this example, a stripe domain is used, a binary number of 0 corresponds to a downward magnetic domain, a binary number of 1 corresponds to an upward magnetic domain. FIG. 6 is a circuit diagram illustrating another example of a control circuit 15 of a magnetic memory device 10 according to an embodiment of the inventive concepts. Referring to FIG. 6, the control circuit 15 may include a timing adjusting circuit 152, an AND logic circuit 154, an XOR logic circuit 153, and an amplifying circuit 155.

The timing adjusting circuit 152 may adjust a timing of a data (e.g., to compensate for a slower writing speed of the write electrode 14), which is read by the read electrode 12, and may output the data to the AND logic circuit 154, the XOR logic circuit 153, and the amplifying circuit 155.

The XOR logic circuit 153 may execute the XOR logic operation on the data and then may output the result of the operation to the second fixed layer 142.

The AND logic circuit 154 may execute the AND logic operation on the data and then may output the result of the operation to the second magnetic structure 13.

The amplifying circuit 155 may amplify the data and then may output the amplified data to the outside (e.g., an external output). In an embodiment, the amplifying circuit 155 may be an additional (or optional) circuit, which may be used when the data is output to the outside (e.g., external to the magnetic memory device 10 and/or the control circuit 15).

By the previously described configuration, it may be possible for the control circuit 15 to execute an operation of reading data from the first magnetic structure 11 and an operation of writing data in the second magnetic structure 13.

In detail, a reading pulsed signal may be input to a line that is coupled to the first fixed layer 122 and the timing adjusting circuit 152. A voltage of the reading pulsed signal may be changed from a low level (e.g., of 0V) to a high level (e.g., a positive voltage level).

If the data read by the read electrode 12 is the downward magnetic domain, the voltage of the first fixed layer 122 of the read electrode 12 may become high and the voltage of the first magnetic structure 11 may become low. If such a voltage is applied to the AND logic circuit 154 and the XOR logic circuit 153, a high voltage from the XOR logic circuit 153 may be applied to the second fixed layer 142 and a low voltage from the AND logic circuit 154 may be applied to the second magnetic structure 13. As a result, the downward magnetic domain may be written in the second magnetic structure 13.

If the data read by the read electrode 12 is the upward magnetic domain, the voltage of the first fixed layer 122 of the read electrode 12 may become low and the voltage of the first magnetic structure 11 may become high. If such a voltage is applied to the AND logic circuit 154 and the XOR logic circuit 153, a low voltage from the XOR logic circuit 153 may be applied to the second fixed layer 142 and a high voltage from the AND logic circuit 154 may be applied to the second magnetic structure 13. As a result, the upward magnetic domain may be written in the second magnetic structure 13.

As a result of the afore-described configuration, it may be possible for the control circuit 15 to execute an operation of reading data from the first magnetic structure 11 and an operation of writing data in the second magnetic structure 13.

Figure 7:
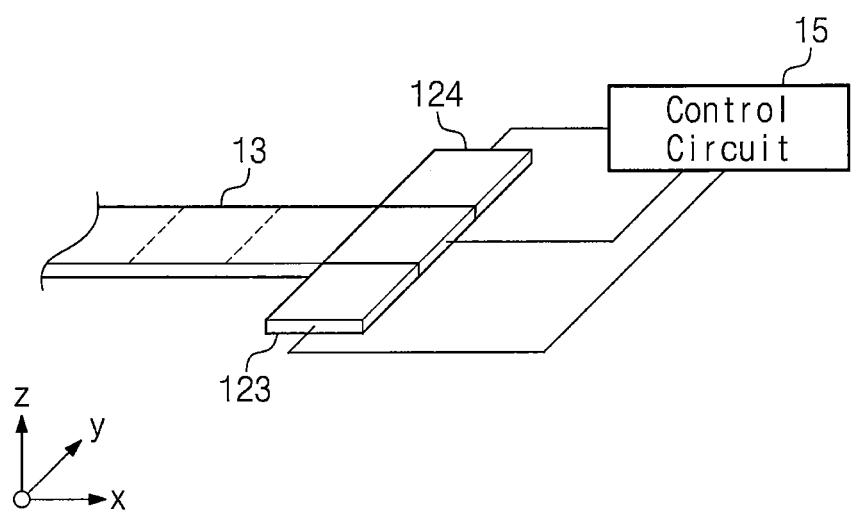
FIG. 7 is a schematic diagram illustrating an example of a write electrode of a magnetic memory device according to an embodiment of the inventive concepts.

Next, another example of the write electrode 14 will be described. FIG. 7 is a schematic diagram illustrating an example of a write electrode 14 of a magnetic memory device 10 according to an embodiment of the inventive concepts. Referring to FIG. 7, the write electrode 14 may include a third fixed layer 123 and a fourth fixed layer 124.

The third fixed layer 123 and the fourth fixed layer 124 may have different magnetization directions from each other. For example, the third fixed layer 123 and the fourth fixed layer 124 may be formed of or include at least one of ferromagnetic materials. For example, the third fixed layer 123 and the fourth fixed layer 124 may be formed of or include at least one of CoFeB, CoFe alloy, and/or Co/Pt multilayer. The third fixed layer 123 and the fourth fixed layer 124 may be electrically coupled to the control circuit 15.

In the case where the data to be written is the upward magnetic domain, the control circuit 15 may apply a current between the third fixed layer 123 and the second magnetic structure 13. In the case where the data to be written is the downward magnetic domain, the control circuit 15 may apply a current between the fourth fixed layer 124 and the second magnetic structure 13.

As a result of the previously described configuration, the control circuit 15 may write the data in the second magnetic structure 13.

As described above, the magnetic memory device (e.g., magnetic memory device 10) according to an embodiment of the inventive concepts may include the first magnetic structure (e.g., first magnetic structure 11) with the magnetic anisotropy, the read electrode (e.g., read electrode 12), which is placed on an end of the first magnetic structure to sense a magnetic moment of the first magnetic structure and to convert it to an electric signal, the first power source (e.g., first pulse power source 16), which is used to apply a driving current pulse to the first magnetic structure, the second magnetic structure (e.g., second magnetic structure 13), which is spaced apart from the first magnetic structure, the write electrode (e.g., write electrode 14), which is placed on an end of the second magnetic structure to change a magnetic moment (i.e., data) of the second magnetic structure based on the electric signal, and the second power source (e.g., second pulse power source 17), which is used to apply a driving current pulse to the second magnetic structure. The magnetic memory device according to an embodiment of the inventive concepts may execute operations of writing, moving, and reading data on almost the entire region of the magnetic structure in a more efficient manner, compared with the conventional magnetic memory device.

In an embodiment, the read electrode of the magnetic memory device may include a first non-magnetic layer (e.g., first non-magnetic layer 121), which is disposed on the first magnetic structure, and a first fixed layer (e.g., first fixed layer 122), which is disposed on the first non-magnetic layer. The read electrode may convert a magnetic moment of the first magnetic structure to a current flowing between the first magnetic structure and the first fixed layer. If a region of the first magnetic structure located directly below the first fixed layer has data of 0, the data may be converted to a first current, and if the data is 1, it may be converted to a second current. A magnitude of the first current may be less than a magnitude of the second current. The data may be determined based on a direction of the magnetic moment of the first magnetic structure. If the data are 0 and 1, the relation between the magnitudes of the currents is opposite to that in the above example. In other words, the magnitude of the first current may be greater than the magnitude of the second current. In the case where the magnitude of the first or second current is small, the first or second current may have a value of zero.

In an embodiment, the write electrode of the magnetic memory device may include a second non-magnetic layer (e.g., second non-magnetic layer 141), which is disposed on the second magnetic structure, and a second fixed layer (e.g., second fixed layer 142), which is disposed on the second non-magnetic layer. The write electrode may determine a magnetic moment of the second magnetic structure using a current flow passing through one of the second magnetic structure and the second fixed layer. If a value of the current converted by the read electrode (e.g., the value of the first or second current) is large, a current flow may be produced in the write electrode to sequentially pass through the second fixed layer, the second non-magnetic layer, and a second magnetic structure located directly below the second non-magnetic layer, and in this case, data of 1 may be written in a region of the second magnetic structure that is located directly below the second non-magnetic layer. If the value of the current converted by the read electrode is small or zero, a current flow may be produced in the write electrode to sequentially pass through the second magnetic structure (located directly below the second non-magnetic layer), the second non-magnetic layer, and the second fixed layer, and in this case, data of 0 may be written in a region of the second magnetic structure that is located directly below the second non-magnetic layer. However, the direction of the current flow may be changed depending on a correspondence relation between the magnetic moment and the data "0" and "1" or a sign of a current-induced spin polarization ratio in the second magnetic structure.

In an embodiment, the write electrode of the magnetic memory device may include two fixed layers (e.g., the third and fourth fixed layers 123 and 124) having different magnetization directions from each other, and the second magnetic structure may be disposed between the two fixed layers. The write electrode may determine a magnetic moment of the second magnetic structure using a current flow passing through one of the two fixed layers and the second magnetic structure. If the value of the current converted by the read electrode is large, a current flow may be produced in the write electrode to sequentially pass through one of the two fixed layers and the second magnetic structure, and in this case, data of 1 may be written in a region of the second magnetic structure. If the value of the current converted by the read electrode is small or zero, a current flow may be produced in the write electrode to sequentially pass through the other of the two fixed layers and the second magnetic structure, and in this case, data of 0 may be written in a region of the second magnetic structure. However, the direction of the current flow may be changed depending on a correspondence relation between the magnetic moment and the data "0" and "1" or a sign of a current-induced spin polarization ratio in the second magnetic structure.

In an embodiment, the magnetic memory device may further include a first pulse power source (e.g., first pulse power source 16) providing a current to opposite ends of the first magnetic structure and a second pulse power source (e.g., second pulse power source 17) providing a current to opposite ends of the second magnetic structure. Data written in the first magnetic structure may be moved in the first magnetic structure by a current flow provided from the first pulse power source to the first magnetic structure. Data written in the second magnetic structure may be moved in the second magnetic structure by a current flow provided from the second pulse power source to the second magnetic structure.

According to an embodiment of the inventive concepts, a magnetic memory device may include a magnetic structure with a magnetic anisotropy, a read electrode, which is placed on an end of the magnetic structure to sense a magnetic moment of the magnetic structure and convert it to an electric signal, and a write electrode, which is placed on an opposite end of the magnetic structure to execute a data writing operation of changing a magnetic moment of the magnetic structure, based on the electric signal. In this case, the magnetic memory device may apply a driving current pulse to the magnetic structure using a single power source. The magnetic memory device according to an embodiment of the inventive concepts may execute operations of writing, moving, and reading data on almost the entire region of the magnetic structure in a more efficient manner, compared with the conventional magnetic memory device.

In an embodiment, the read electrode of the magnetic memory device may include a first non-magnetic layer, which is disposed on the magnetic structure, and a first fixed layer, which is disposed on the first non-magnetic layer. The read electrode may convert a magnetic moment of the magnetic structure to a current flowing between the magnetic structure and the first fixed layer. If a region of the magnetic structure located directly below the first fixed layer has data of 0, the data may be converted to a first current, and if the data is 1, it may be converted to a second current. The first current may be smaller than the second current. The data may be determined based on a direction of the magnetic moment of the magnetic structure. If the data are 0 and 1, the relation between the magnitudes of the currents is opposite to that in the above example. In other words, the magnitude of the first current may be greater than the magnitude of the second current. In the case where the magnitude of the first or second current is small, the first or second current may have a value of zero.

In an embodiment, the write electrode of the magnetic memory device may include a second non-magnetic layer, which is disposed on the magnetic structure, and a second fixed layer, which is disposed on the second non-magnetic layer. The write electrode may determine a magnetic moment of the magnetic structure using a current flow passing through the magnetic structure and the second fixed layer. If the value of the current converted by the read electrode is large, a current flow may be produced in the write electrode to sequentially pass through the second fixed layer, the second non-magnetic layer, and the magnetic structure located directly below the second non-magnetic layer, and in this case, data of 1 may be written in a region of the magnetic structure that is located directly below the second non-magnetic layer. If the value of the current converted by the read electrode is small or almost zero, a current flow may be produced in the write electrode to sequentially pass through the second magnetic structure (located directly below the second non-magnetic layer), the second non-magnetic layer, and the second fixed layer, and in this case, data of 0 may be written in a region of the magnetic structure that is located directly below the second non-magnetic layer. However, the direction of the current may be changed to the opposite direction, depending on a correspondence relation between the magnetic moment and the data "0" and "1" or a sign of a current-induced spin polarization ratio in the magnetic structure.

In an embodiment, the write electrode of the magnetic memory device may include two fixed layers having different magnetization directions from each other, and the magnetic structure may be disposed between the two fixed layers. The write electrode may determine a magnetic moment of the magnetic structure using a current flow passing through one of the two fixed layers and the magnetic structure. If the value of the current converted by the read electrode is large, a current flow may be produced in the write electrode to sequentially pass through one of the two fixed layers and the magnetic structure, and in this case, data of 1 may be written in a region of the magnetic structure. If the value of the current converted by the read electrode is small or almost zero, a current flow may be produced in the write electrode to sequentially pass through the other of the two fixed layers and the magnetic structure, and in this case, data of 0 may be written in a region of the magnetic structure. However, the direction of the current may be changed to the opposite direction, depending on a correspondence relation between the magnetic moment and the data "0" and "1" or a sign of a current-induced spin polarization ratio in the magnetic structure.

In an embodiment, the magnetic memory device may further include a pulse power source providing a current to opposite ends of the magnetic structure. Data written in the magnetic structure may be moved in the magnetic structure by a current flow provided from the pulse power source to the magnetic structure.

In an embodiment, the magnetic memory device may further include a control circuit (e.g., control circuit 15), which is configured to buffer data, which is read by the read electrode, and then to output the data to the write electrode when the movement of the magnetic domain in the magnetic structure is finished. Accordingly, it may be possible to write data, which is stored in a region of the magnetic structure located directly below the read electrode, to another region of the magnetic structure located directly below the write electrode at a proper timing. In the case where there is a remaining data in the region of the magnetic structure located directly below the write electrode, the writing operation may be performed after moving the data to another region of the magnetic structure, and in this case, it may be possible to prevent data from being lost. In an embodiment, while moving data, which is stored in the magnetic structure, to another region of the magnetic structure, data in a region of the magnetic structure located directly below the read electrode may be written in another region of the magnetic structure located directly below the write electrode, and in this case, it may be possible to reduce a time loss in the data transfer process.

In an embodiment, the magnetic memory device may further include a control circuit configured to output data, which is read by the read electrode, to both of the write electrode and the outside (e.g., external to the memory device and/or the control circuit). In this case, the read data may be transferred to and utilized by an external memory device (e.g., CPU or USB memory). In the case where the read data is transferred to another magnetic memory device, an operation of copying data between magnetic memory devices may be possible.

Figure 8:
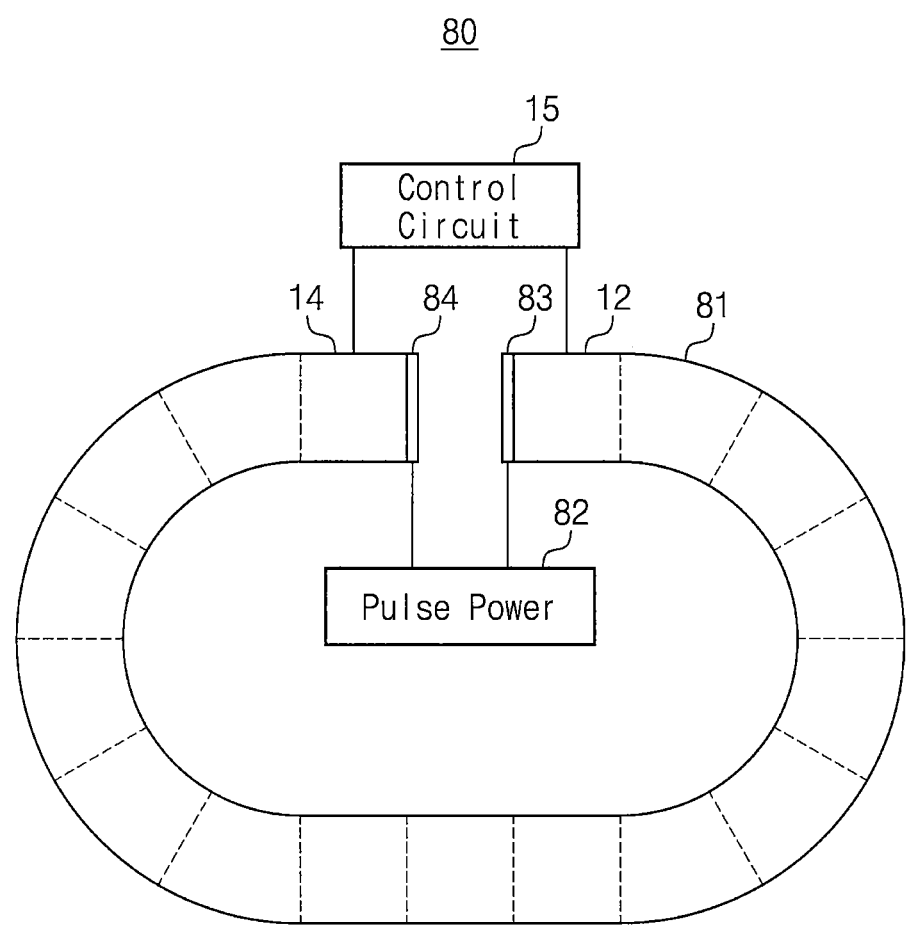
FIG. 8 is a perspective view illustrating a schematic structure of a magnetic memory device according to an embodiment of the inventive concepts.

Hereinafter, an example in which the magnetic structure has a ring or loop shape will be described. FIG. 8 is a perspective view illustrating a schematic structure of a magnetic memory device 80 according to an embodiment of the inventive concepts. Referring to FIG. 8, a magnetic memory device 80 may include a magnetic structure 81, a read electrode 12, a write electrode 14, a control circuit 15, a pulse power source 82, a first electrode 83, and a second electrode 84. For concise description, an element previously described with reference to FIG. 1 may be identified by the same reference number without repeating an overlapping description thereof.

The magnetic structure 81 may have a magnetic anisotropy. The magnetic structure 81 may be formed of or include at least one of ferromagnetic metals. The magnetic structure 81 may be a magnetic nanowire, which has a long, thin, and partially-cut open ring shape. A current flow in the magnetic structure 81 may lead to a movement of a magnetic domain wall (i.e., a boundary between magnetic domains having their own magnetization directions). Thus, the magnetic memory device 80 may serve as a domain wall movable-type magnetic memory. For example, the magnetic structure 81 may be formed of or include at least one of Co/Ni multilayer, CoNi alloy, Co/Pd multilayer, CoPd alloy, Co/Pt multilayer, CoPt alloy, Tb/FeCo multilayer, TbFeCo alloy, Fe/Ni multilayer, FeNi alloy, CoFeB alloy, and/or CoFe alloy.

The pulse power source 82 may be configured to provide a current to opposite ends of the magnetic structure 81. If a pulsed voltage from the pulse power source 82 is applied to opposite ends of the magnetic structure 81, a magnetic domain of the magnetic structure 81 may be moved. In detail, the pulse power source 82 may produce a voltage difference between the first electrode 83 and the second electrode 84.

To precisely control the position of the magnetic domain, the pulse power source 82 may be configured to produce a current of rectangular-like waveform, in ON/OFF steps. In detail, a DC applying time of the pulse power source 82 may be given by $n*t$, where $t$ denotes a current applying time which is taken to move the magnetic domain by a one bit length, and $n$ is an integer of 1 or greater. The pulse power source 82 may apply a voltage suitable for a current driving of the magnetic domain. For example, the voltage may be determined in consideration of a resistance value and a domain wall moving speed of the magnetic structure 81. The pulse power source 82 is illustrated as a functional block in FIG. 8.

The first electrode 83 may be placed on an end or a first end of the magnetic structure 81, which is close to the read electrode 12. The second electrode 84 may be placed on an opposite end or a second end of the magnetic structure 81, which is close to the write electrode 14. In an embodiment, each of the first and second electrodes 83 and 84 may be formed of or include at least one of non-magnetic metals.

In the magnetic memory device according to this embodiment, data, which is read by the read electrode 12, may be written in the magnetic structure 81, which is provided in an open circular shape, using the write electrode 14. Data may be moved between the read electrode 12 and the write electrode 14. Data, which is written in the magnetic structure, may be moved in the magnetic structure by a current flow that is provided to the magnetic structure from the pulse power source 82. Accordingly, it may be possible to more efficiently execute operations of writing, moving, and reading data on almost the entire region of the magnetic structure, compared with the conventional magnetic memory device.

Since the control circuit 15 is configured to output data to the outside (e.g., external to the magnetic memory device 80 and/or the control circuit 15), data, which is read by the read electrode 12, may be transferred to and utilized by an external memory device (e.g., CPU or USB memory). In the case where the read data is transferred to other magnetic memory device, an operation of copying data between magnetic memory devices may be possible.

The inventive concepts are not limited to the previously described embodiments, and variations in form and detail may be made therein without departing from the spirit and scope of the attached claims. For example, the shape of the magnetic structure 81 may be variously changed to a polygonal ring, a circular ring, a ring with linear and curved portions, and so forth. In some embodiments, the magnetic structure may be any continuous structure.

The sectional shapes of the first magnetic structure 11, the second magnetic structure 13, and the magnetic structure 81 may not be limited to the previously described examples. For example, the sectional shape of the first magnetic structure 11 may be shape like a circle, an ellipse, a polygon, or any combination thereof. Furthermore, such modifications may be applied to all other embodiments according to the inventive concepts.

Figure 9:
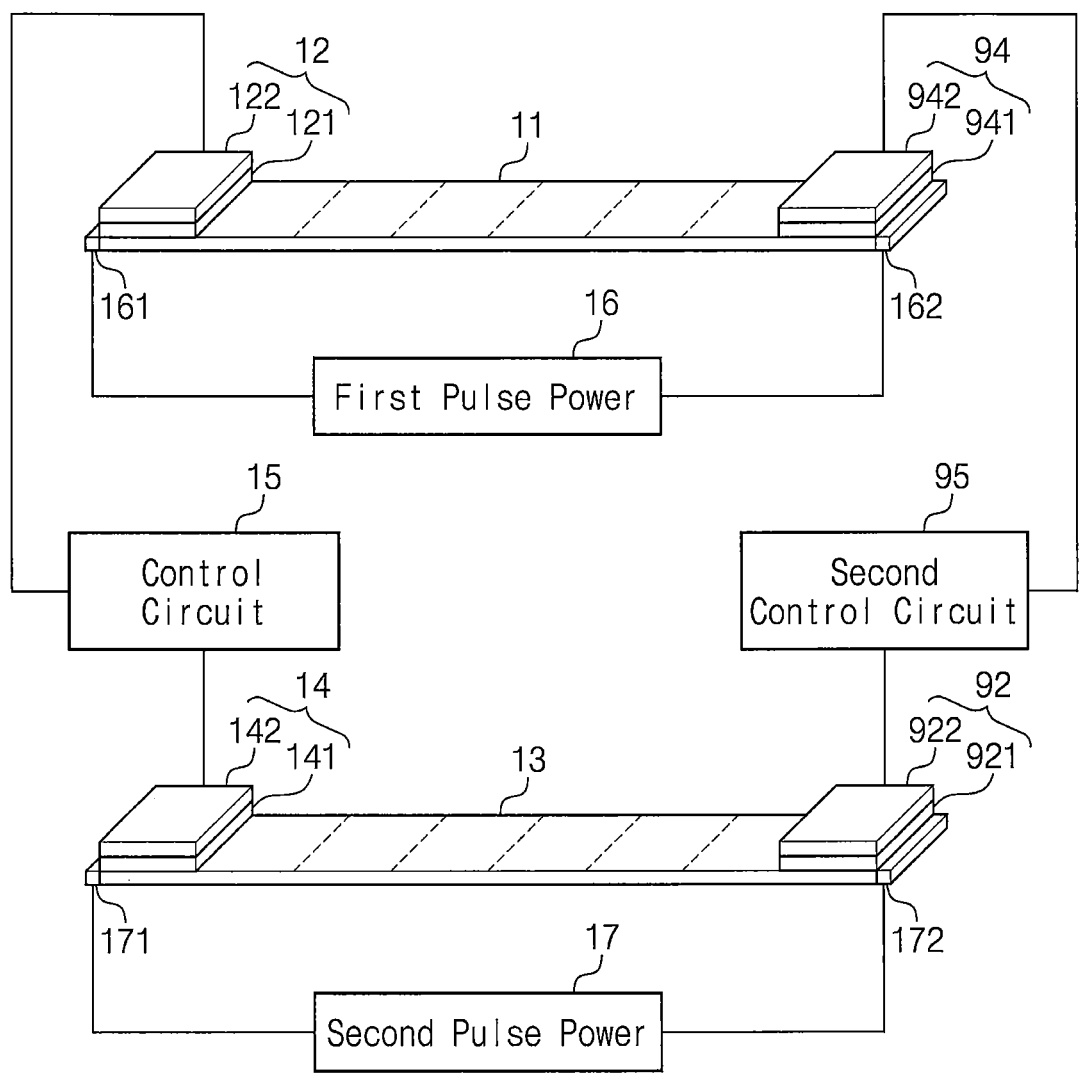
FIG. 9 is a perspective view illustrating a schematic structure of a magnetic memory device according to an embodiment of the inventive concepts.

In addition, a pair of magnetic structures may be connected to each other by a pair of control circuits. FIG. 9 is a perspective view illustrating a schematic structure of a magnetic memory device 90 according to an embodiment of the inventive concepts. In the following description of FIG. 9, an element previously described with reference to FIG. 1 may be identified by the same reference number without repeating an overlapping description thereof. Referring to FIG. 9, a magnetic memory device 90 may include the first magnetic structure 11, the read electrode 12, the second magnetic structure 13, the write electrode 14, the control circuit 15, the first pulse power source 16, the second pulse power source 17, a second read electrode 92, a second write electrode 94, and a second control circuit 95.

The second read electrode 92 may be used to convert a magnetic moment, which is measured from the second magnetic structure 13, into an electric signal. For example, the second read electrode 92 may be disposed on an end of the second magnetic structure 13. For example, the second read electrode 92 may include a third non-magnetic layer 921, which is disposed on the second magnetic structure 13, and a third fixed layer 922, which is disposed on the third non-magnetic layer 921.

The third non-magnetic layer 921 may have substantially the same structure as the first non-magnetic layer 121. The third fixed layer 922 may have substantially the same structure as the first fixed layer 122.

The second write electrode 94 may be used to perform a data writing operation of changing a magnetic moment of the first magnetic structure 11. For example, the second write electrode 94 may be disposed on an end of the first magnetic structure 11. For example, the second write electrode 94 may include a fourth non-magnetic layer 941, which is disposed on the first magnetic structure 11, and a fourth fixed layer 942, which is disposed on the fourth non-magnetic layer 941. The fourth non-magnetic layer 941 may have substantially the same structure as the second non-magnetic layer 141. The fourth fixed layer 942 may have substantially the same structure as the second fixed layer 142.

The second control circuit 95 may control an operation of reading data from the second magnetic structure 13 and an operation of writing data in the first magnetic structure 11. For example, the second control circuit 95 may read data from the second magnetic structure 13 using the second read electrode 92, when the magnetic domain of the second magnetic structure 13 is moved by the second pulse power source 17. The second control circuit 95 may write data in the first magnetic structure 11 using the second write electrode 94, when the magnetic domain of the first magnetic structure 11 is moved by the first pulse power source 16. A detailed structure of the second control circuit 95 may be substantially the same as the control circuit 15.

As a result of the previously described configuration, it may be possible to more efficiently execute operations of writing, moving, and reading data on almost the entire region of the magnetic structure, compared with the conventional magnetic memory device.

Furthermore, embodiments in which two magnetic structures are coupled to each other have been described, but in some embodiments, three or more magnetic structures may be coupled to each other by a control circuit. In such an embodiment, a pulse power source may be coupled to opposite ends of each magnetic structure, and the magnetic structures may be coupled to a control circuit. The magnetic structure and the control circuit may be coupled in a loop shape or in series.

Each of read and write electrodes may be used as an electrode which can be used for both of reading and writing operations. In this case, a bi-directional motion of magnetic domain may be possible, and this may make it possible to reduce an operation time taken to finish the reading and writing operations.

According to an embodiment of the inventive concepts, a magnetic memory device may be configured to be enabled to move a position of a data writing region, between two end portions of a magnetic structure. The two end portions of one magnetic structure may be connected to reading and writing devices, and in this case, the magnetic memory device may be configured to allow for a data looping process.

According to an embodiment of the inventive concepts, a magnetic memory device may include a first magnetic structure having a magnetic anisotropy, a read electrode disposed at an end of the first magnetic structure and configured to sense a magnetic moment of the first magnetic structure and convert it to an electric signal, a second magnetic structure having a magnetic anisotropy and being spaced apart from the first magnetic structure, and a write electrode disposed at an end of the second magnetic structure and configured to write the electric signal in the second magnetic structure as a magnetic moment.

In an embodiment, the magnetic memory device may further include a power source, which is used to apply a driving current pulse to the magnetic structure. The magnetic memory device may execute operations of writing, moving, and reading data on almost the entire region of the magnetic structure in a more efficient manner, compared with the conventional magnetic memory device.

In an embodiment, the read electrode of the magnetic memory device may include a first non-magnetic layer, which is disposed on the first magnetic structure, and a first fixed layer, which is disposed on the first non-magnetic layer. The read electrode may convert a magnetic moment of the first magnetic structure to a current, which flows between the first magnetic structure and the first fixed layer.

In a magnetic memory device according to an embodiment of the inventive concepts, if the first magnetic structure, which is placed directly below the first fixed layer, has data of 0, the magnetic moment of the first magnetic structure may be converted to a first current, and if the data is 1, the magnetic moment of the first magnetic structure may be converted to a second current. A magnitude of the first current may be less than a magnitude of the second current. The data may be determined based on a direction of the magnetic moment of the first magnetic structure. If the data are 0 and 1, the relation between the magnitudes of the currents is opposite to that in the above example. In other words, the magnitude of the first current may be greater than the magnitude of the second current. In the case where the magnitude of the first or second current is small, the first or second current may have a value of zero.

In an embodiment, the write electrode of the magnetic memory device may include a second non-magnetic layer, which is disposed on the second magnetic structure, and a second fixed layer, which is disposed on the second non-magnetic layer. The write electrode may determine a magnetic moment of the second magnetic structure using a current flow passing through the second magnetic structure and the second fixed layer.

In the magnetic memory device according to an embodiment of the inventive concepts, if a value of the current (e.g., the value of the first or second current) converted by the read electrode is large, a current flow may be produced in the write electrode to sequentially pass through the second fixed layer, the second non-magnetic layer, and a second magnetic structure (located directly below the second non-magnetic layer), and in this case, data of 1 may be written in a region of the second magnetic structure that is located directly below the second non-magnetic layer. If the value of the current converted by the read electrode is small or almost zero, a current flow may be produced in the write electrode to sequentially pass through the second magnetic structure (located directly below the second non-magnetic layer), the second non-magnetic layer, and the second fixed layer, and in this case, data of 0 may be written in a region of the second magnetic structure located directly below the second non-magnetic layer. However, the direction of the current flow may be changed depending on a correspondence relation between the magnetic moment and the data "0" and "1" or a sign of a current-induced spin polarization ratio in the second magnetic structure.

In an embodiment, the write electrode of the magnetic memory device may include two fixed layers having different magnetization directions from each other, and the second magnetic structure may be disposed between the two fixed layers. The write electrode may determine a magnetic moment of the second magnetic structure using a current flow passing through one of the two fixed layers and the second magnetic structure.

In a magnetic memory device according to an embodiment of the inventive concepts, if a value of the current converted by the read electrode (e.g., the value of the first or second current) is large, a current flow may be produced in the write electrode to sequentially pass through one of the two fixed layers and the second magnetic structure, and in this case, data of 1 may be written in a region of the second magnetic structure. If the value of the current converted by the read electrode is small or almost zero, a current flow may be produced in the write electrode to sequentially pass through the other of the two fixed layers and the second magnetic structure, and in this case, data of 0 may be written in a region of the second magnetic structure. However, the direction of the current flow may be changed depending on a correspondence relation between the magnetic moment and the data "0" and "1" or a sign of a current-induced spin polarization ratio in the second magnetic structure.

In an embodiment, the magnetic memory device may further include a first pulse power source providing a current to opposite ends of the first magnetic structure and a second pulse power source providing a current to opposite ends of the second magnetic structure.

In a magnetic memory device according to an embodiment of the inventive concepts, data written in the first magnetic structure may be moved in the first magnetic structure by a current flow provided from the first pulse power source to the first magnetic structure, and data written in the second magnetic structure may be moved in the second magnetic structure by a current flow provided from the second pulse power source to the second magnetic structure.

According to an embodiment of the inventive concepts, a magnetic memory device may include a magnetic structure with a magnetic anisotropy, a read electrode, which is placed on an end of the magnetic structure and configured to sense a magnetic moment of the magnetic structure and convert it to an electric signal, and a write electrode, which is placed on an opposite end of the magnetic structure and configured to execute a data writing operation of changing a magnetic moment of the magnetic structure, based on the electric signal.

In an embodiment, the magnetic memory device may further include a power source applying a driving current pulse to the magnetic structure. The magnetic memory device may execute operations of writing, moving, and reading data on almost the entire region of the magnetic structure in a more efficient manner, compared with the conventional magnetic memory device.

In an embodiment, the read electrode of the magnetic memory device may include a first non-magnetic layer, which is disposed on the magnetic structure, and a first fixed layer, which is disposed on the first non-magnetic layer. The read electrode may convert a magnetic moment of the magnetic structure to a current, which flows between the magnetic structure and the first fixed layer.

In a magnetic memory device according to an embodiment of the inventive concepts, if the magnetic structure located directly below the first fixed layer has data of 0, the magnetic moment of the magnetic structure may be converted to a first current, and if the data is 1, the magnetic moment of the magnetic structure may be converted to a second current. A magnitude of the first current may be less than a magnitude of the second current. The data may be determined based on a direction of the magnetic moment of the magnetic structure. If the data are 0 and 1, the relation between the magnitudes of the currents is opposite to that in the above example. In other words, the magnitude of the first current may be greater than the magnitude of the second current. In the case where the magnitude of the first or second current is small, the first or second current may have a value of zero.

In an embodiment, the write electrode of the magnetic memory device may include a second non-magnetic layer, which is disposed on the magnetic structure, and a second fixed layer, which is disposed on the second non-magnetic layer. The write electrode may determine a magnetic moment of the magnetic structure using a current flow passing through the magnetic structure and the second fixed layer.

In a magnetic memory device according to an embodiment of the inventive concepts, if a value of the current converted by the read electrode (e.g., the value of the first or second current) is large, a current flow may be produced in the write electrode to sequentially pass through the second fixed layer, the second non-magnetic layer, and the magnetic structure (located directly below the second non-magnetic layer), and in this case, data of 1 may be written in a region of the magnetic structure located directly below the second non-magnetic layer. If the value of the current converted by the read electrode is small or almost zero, a current flow may be produced in the write electrode to sequentially pass through the magnetic structure (located directly below the second non-magnetic layer), the second non-magnetic layer, and the second fixed layer, and in this case, data of 0 may be written in a region of the magnetic structure located directly below the second non-magnetic layer. However, the direction of the current may be changed to the opposite direction, depending on a correspondence relation between the magnetic moment and the data "0" and "1" or a sign of a current-induced spin polarization ratio in the magnetic structure.

In an embodiment, the write electrode of the magnetic memory device may include two fixed layers having different magnetization directions from each other, and the magnetic structure may be disposed between the two fixed layers. The write electrode may determine a magnetic moment of the magnetic structure using a current flow passing through one of the two fixed layers and the magnetic structure.

In a magnetic memory device according to an embodiment of the inventive concepts, if a value of the current converted by the read electrode (e.g., the value of the first or second current) is large, a current flow may be produced in the write electrode to sequentially pass through one of the two fixed layers and the magnetic structure, and in this case, data of 1 may be written in a region of the magnetic structure. If the value of the current converted by the read electrode is small or almost zero, a current flow may be produced in the write electrode to sequentially pass through the other of the two fixed layers and the magnetic structure, and in this case, data of 0 may be written in a region of the magnetic structure. However, the direction of the current may be changed to the opposite direction, depending on a correspondence relation between the magnetic moment and the data "0" and "1" or a sign of a current-induced spin polarization ratio in the magnetic structure.

In an embodiment, the magnetic memory device may further include a pulse power source providing a current to opposite ends of the magnetic structure.

In a magnetic memory device according to an embodiment of the inventive concepts, data written in the magnetic structure may be moved in the magnetic structure by a current flow provided from the pulse power source to the magnetic structure.

In an embodiment, the magnetic memory device may further include a control circuit configured to buffer data, which is read by the read electrode, and then output the data to the write electrode when the movement of the magnetic domain in the magnetic structure is finished.

In an embodiment, the magnetic memory device may be configured to write data, which is stored in a region of the magnetic structure located directly below the read electrode, to another region of the magnetic structure located directly below the write electrode at a proper timing. In the case where there is a remaining data in the region of the magnetic structure located directly below the write electrode, the writing operation may be performed after moving the data to another region of the magnetic structure (i.e., after the shift of the magnetic domain in the magnetic structure), and in this case, it may be possible to prevent data from being lost. In an embodiment, while moving data, which is written in the magnetic structure, to another region of the magnetic structure, data in a region of the magnetic structure located directly below the read electrode may be written in another region of the magnetic structure located directly below the write electrode, and in this case, it may be possible to reduce a time loss in the data transfer process.

In an embodiment, the magnetic memory device may further include a control circuit configured to output data, which is read by the read electrode, to both of the write electrode and the outside (e.g., external to the memory device and/or the control circuit).

In an embodiment, the magnetic memory device may transfer read data to an external memory device (e.g., CPU or USB memory), and in this case, the read data may be utilized by the external memory device. In the case where the read data is transferred to another magnetic memory device, an operation of copying data between magnetic memory devices may be possible.

While example embodiments of the inventive concepts have been particularly shown and described, it will be understood by one of ordinary skill in the art that variations in form and detail may be made therein without departing from the scope of the attached claims.

What is claimed is:

1. A magnetic memory device, comprising:
a first magnetic structure comprising a first magnetic anisotropy;
a read electrode on an end of the first magnetic structure and configured to sense a first magnetic moment of the first magnetic structure and to convert the first magnetic moment to an electric signal;
a second magnetic structure spaced apart from the first magnetic structure, the second magnetic structure comprising a second magnetic anisotropy; and
a write electrode on an end of the second magnetic structure and configured to change a second magnetic moment of the second magnetic structure based on the electric signal,
wherein the write electrode comprises two fixed layers having different magnetization directions from each other, wherein the second magnetic structure is between the two fixed layers, and wherein the write electrode is configured to change the second magnetic moment of the second magnetic structure using a second current flow passing through one of the two fixed layers and the second magnetic structure.

2. The magnetic memory device of claim 1, wherein the read electrode comprises a first non-magnetic layer on the first magnetic structure and a first fixed layer on the first non-magnetic layer, and wherein the read electrode is configured to convert the first magnetic moment of the first magnetic structure to a first current flowing between the first magnetic structure and the first fixed layer.

3. The magnetic memory device of claim 1, further comprising:

a first pulse power source configured to provide a first current to opposite ends of the first magnetic structure; and a second pulse power source configured to provide a second current to opposite ends of the second magnetic structure.

4. The magnetic memory device of claim 1, further comprising a control circuit that is configured to buffer data that is read by the read electrode and to output the data to the write electrode responsive to completion of a process of moving a magnetic domain in the second magnetic structure.

5. A magnetic memory device, comprising:

a magnetic structure comprising a magnetic anisotropy;

a read electrode on an end of the magnetic structure and configured to sense a first magnetic moment of the magnetic structure and to convert the first magnetic moment to an electric signal; and a write electrode on an opposite end of the magnetic structure and configured to change a second magnetic moment of the magnetic structure based on the electric signal, wherein the write electrode comprises two fixed layers having different magnetization directions from each other, wherein the magnetic structure is between the two fixed layers, and wherein the write electrode is configured to change the second magnetic moment of the magnetic structure using a second current flow passing through one of the two fixed layers and the magnetic structure.

6. The magnetic memory device of claim 5, wherein the read electrode comprises a first non-magnetic layer on the magnetic structure and a first fixed layer on the first non-magnetic layer, and wherein the read electrode is configured to convert the first magnetic moment of the magnetic structure to a first current flowing between the magnetic structure and the first fixed layer.

7. The magnetic memory device of claim 5, further comprising a control circuit that is configured to buffer data that is read by the read electrode and to output the data to the write electrode responsive to completion of a process of moving a magnetic domain in the magnetic structure.

8. The magnetic memory device of claim 5, further comprising a control circuit that is configured to output data that is read by the read electrode to both the write electrode and external to the magnetic memory device.

9. The magnetic memory device of claim 5, further comprising a pulse power source configured to provide a current to the end and the opposite end of the magnetic structure.

10. A magnetic memory device, comprising:

a magnetic structure comprising a magnetic anisotropy;

a read electrode on a first end of the magnetic structure and configured to sense a first magnetic moment of the magnetic structure and to convert the first magnetic moment to an electric signal;

a write electrode on a second end of the magnetic structure and configured to change a second magnetic moment of the magnetic structure based on the electric signal, wherein the write electrode comprises two fixed layers having different magnetization directions from each other and the write electrode is configured to change the second magnetic moment of the magnetic structure using a second current flow passing through the magnetic structure and one of the two fixed layers; and a control circuit that is configured to transfer data that is read by the read electrode to the write electrode.

11. The magnetic memory device of claim 10, wherein the read electrode comprises a first non-magnetic layer on the magnetic structure and a first fixed layer on the first non-magnetic layer, and wherein the read electrode is configured to convert the first magnetic moment of the magnetic structure to a first current flowing between the magnetic structure and the first fixed layer.

12. The magnetic memory device of claim 10, wherein the control circuit comprises a timing adjusting circuit that is configured to adjust a timing of the data that is read by the read electrode to compensate for a writing speed of the write electrode.

13. The magnetic memory device of claim 10, wherein the magnetic structure comprises a first magnetic structure and a second magnetic structure spaced apart from one another, wherein the first end of the magnetic structure is an end of the first magnetic structure, wherein the second end of the magnetic structure is an end of the second magnetic structure, and wherein the magnetic memory device further comprises:

a first pulse power source configured to provide a first current to the first end and an opposite end of the first magnetic structure, the first current configured to move a first magnetic domain of the first magnetic structure; and a second pulse power source configured to provide a second current to the second end and an opposite end of the second magnetic structure, the second current configured to move a second magnetic domain of the second magnetic structure.

14. The magnetic memory device of claim 10, wherein the first end and the second end of the magnetic structure are opposite ends of the magnetic structure, and wherein the magnetic memory device further comprises a pulse power source configured to provide a current to the first end and the second end of the magnetic structure, the current configured to move a magnetic domain of the magnetic structure.

\* \* \* \* \*